United States Patent
Kadosh et al.

(10) Patent No.: US 8,190,391 B2
(45) Date of Patent: May 29, 2012

(54) DETERMINING DIE PERFORMANCE BY INCORPORATING NEIGHBORING DIE PERFORMANCE METRICS

(75) Inventors: Daniel Kadosh, Austin, TX (US); Gregory A. Cherry, Kyle, TX (US); Carl I. Bowen, Austin, TX (US); Luis De La Fuente, Austin, TX (US); Rajesh Vijayaraghavan, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 842 days.

(21) Appl. No.: 11/692,989

(22) Filed: Mar. 29, 2007

(65) Prior Publication Data
US 2008/0244348 A1  Oct. 2, 2008

(51) Int. Cl.
*G01R 15/00* (2006.01)
*G01R 29/00* (2006.01)
*G01R 31/26* (2006.01)
*G01N 37/00* (2006.01)
*H01L 21/66* (2006.01)
*G06F 19/00* (2006.01)

(52) U.S. Cl. ............ 702/118; 702/57; 702/81; 438/14; 700/121; 324/762.03

(58) Field of Classification Search ............ 702/57–59, 702/81–84, 182–185, 117, 118, 108, 127, 702/179; 438/15–17; 700/108, 97, 121–123, 700/95–96; 324/765, 754, 759, 719
See application file for complete search history.

(56) References Cited

U.S. PATENT DOCUMENTS

| | | | |
|---|---|---|---|
| 5,519,193 A | 5/1996 | Freiermuth et al. | 219/678 |
| 6,265,232 B1 | 7/2001 | Simmons | 438/14 |
| 6,338,001 B1 | 1/2002 | Steffan et al. | 700/121 |
| 6,414,508 B1 | 7/2002 | London | 324/765 |
| 6,844,747 B2 | 1/2005 | Abadeer et al. | 324/750 |
| 6,928,628 B2 * | 8/2005 | Seligson et al. | 716/4 |
| 6,943,042 B2 * | 9/2005 | Madge et al. | 438/14 |
| 6,959,224 B2 * | 10/2005 | Good et al. | 700/97 |
| 7,197,469 B2 * | 3/2007 | Hegde et al. | 705/8 |
| 7,198,964 B1 * | 4/2007 | Cherry et al. | 438/14 |
| 7,248,939 B1 * | 7/2007 | Chamness et al. | 700/121 |
| 7,415,386 B2 * | 8/2008 | Burch et al. | 702/183 |
| 2002/0095278 A1 | 7/2002 | Riley et al. | 703/2 |
| 2002/0121915 A1 * | 9/2002 | Alonso Montull et al. | 324/765 |
| 2002/0135389 A1 | 9/2002 | Melgaard et al. | 324/760 |
| 2002/0161532 A1 | 10/2002 | Dor et al. | 702/35 |
| 2004/0006755 A1 * | 1/2004 | Swanson et al. | 716/19 |
| 2004/0040003 A1 | 2/2004 | Seligson et al. | 716/4 |

(Continued)

OTHER PUBLICATIONS

"Unit Level Predicted Yield: a Method of Identifying High Defect Density Die at Wafer Sort" Russell B. Miller, et al., IEEE 2001.

(Continued)

*Primary Examiner* — Michael Nghiem
*Assistant Examiner* — Ricky Ngon
(74) *Attorney, Agent, or Firm* — Williams, Morgan & Amerson, P.C.

(57) ABSTRACT

A method includes receiving a first set of parameters associated with a plurality of die. A first die performance metric associated with a selected die is determined based on the first set of parameters. At least one neighborhood die performance metric associated with a set comprised of a plurality of die that neighbor the selected die is determined based on the first set of parameters. A second die performance metric is determined for the selected die based on the first die performance metric and the neighborhood die performance metric.

20 Claims, 4 Drawing Sheets

U.S. PATENT DOCUMENTS

| | | | |
|---|---|---|---|
| 2005/0085932 A1* | 4/2005 | Aghababazadeh et al. | 700/108 |
| 2005/0125090 A1* | 6/2005 | Sakano et al. | 700/108 |
| 2006/0009872 A1* | 1/2006 | Prager et al. | 700/108 |
| 2007/0007981 A1 | 1/2007 | Golan | 324/765 |
| 2007/0239386 A1* | 10/2007 | Capps et al. | 702/117 |
| 2008/0262769 A1 | 10/2008 | Kadosh et al. | 402/82 |

OTHER PUBLICATIONS

"Reliability Improvement and Burn in Optimization Through the Use of Die Level Predictive Modeling" Walter Carl Riordan, et al., International Reliability Physics Symposium, 2005.

Seminar entitled "Data Driven Statistical Testing from Test Response to Test Information" Professor Robert Daasch Portland State University Oct. 2006.

Office Action from related U.S. Appl. No. 11/745,688 dated Mar. 11, 2008.

Office Action from related U.S. Appl. No. 11/745,688 dated Aug. 5, 2008.

Office Action from related U.S. Appl. No. 11/745,688 dated Dec. 3, 2008.

* cited by examiner

DETERMINING DIE PERFORMANCE BY INCORPORATING NEIGHBORING DIE PERFORMANCE METRICS

CROSS-REFERENCE TO RELATED APPLICATIONS

Not applicable.

BACKGROUND OF THE INVENTION

The present invention relates generally to manufacturing and testing of semiconductor devices, more particularly, to determining die performance by incorporating neighboring die performance metrics.

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost of integrated circuit devices incorporating such transistors.

Generally, a distinct sequence of processing steps is performed on a lot of wafers using a variety of processing tools, including photolithography steppers, etch tools, deposition tools, polishing tools, rapid thermal processing tools, implantation tools, etc., to produce final products that meet certain electrical performance requirements. In some cases, electrical measurements that determine the performance of the fabricated devices are not conducted until relatively late in the fabrication process, and sometimes not until the final test stage.

Long term reliability of fabricated devices is validated in semiconductor manufacturing by accelerated stressing of potentially faulty parts through a burn-in process. Burn-in is the single most expensive process packaged parts go through, so ideally only a small percentage of production should undergo burn-in. Burn-in is a method where an IC device is subjected to stress level operating conditions for the purpose of accelerating early failures that may occur when the IC device is assembled in a product. Burn-in generally involves elevating the temperature of an IC device beyond normal operating conditions and electrically exercising the IC device.

Burn-in testing by stressing a group of IC devices may weed out weak IC devices, but it also weakens the IC devices that do not fail and thus reduces the quality of the remaining IC devices. Burn-in may be used to improve the manufacturing process of a particular IC device. During burn-in testing, IC devices are stressed to failure, the failures are analyzed, and the results of the analysis are used to modify the manufacturing process.

Due to the expensive nature and potentially destructive nature of burn-in testing, only the most at-risk parts should undergo burn-in. Due to the complexity of integrated circuit devices, and the costs associated with screening devices to identify which are most at-risk, it is often difficult to identify the population that should be subjected to burn-in.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in a method that includes receiving a first set of parameters associated with a plurality of die. A first die performance metric associated with a selected die is determined based on the first set of parameters. At least one neighborhood die performance metric associated with a set comprised of a plurality of die that neighbor the selected die is determined based on the first set of parameters. A second die performance metric is determined for the selected die based on the first die performance metric and the neighborhood die performance metric.

Another aspect of the present invention is seen in a system including a metrology tool and a die performance monitor. The first metrology tool is operable to measure a first set of parameters associated with a plurality of die. The die performance unit is operable to determine a first die performance metric associated with a selected die from the plurality of die based on the first set of parameters, determine at least one neighborhood die performance metric associated with a set comprised of a plurality of die that neighbor the selected die based on the first set of parameters, and determine a second die performance metric for the selected die based on the first die performance metric and the neighborhood die performance metric.

BRIEF DESCRIPTION OF THE SEVERAL VIEWS OF THE DRAWINGS

The invention will hereafter be described with reference to the accompanying drawings, wherein like reference numerals denote like elements, and.

Figure 1:
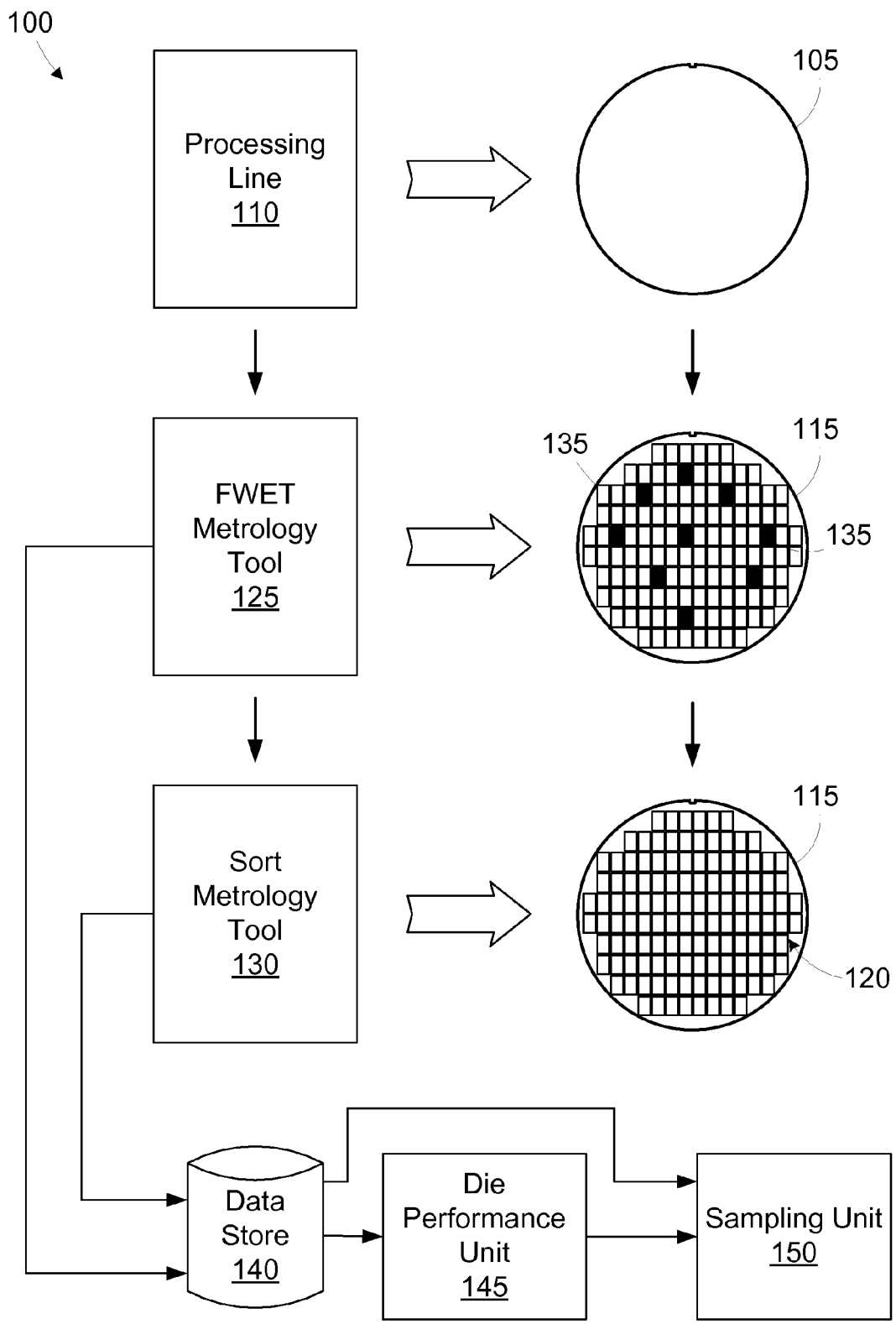
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "accessing" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices. Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

Referring now to the drawings wherein like reference numbers correspond to similar components throughout the several views and, specifically, referring to FIG. 1, the present invention shall be described in the context of a manufacturing system 100. The manufacturing system includes a processing line 110, one or more final wafer electrical test (FWET) metrology tools 125, one or more SORT metrology tools 130, a data store 140, a die performance unit 145, a sampling unit 150. In the illustrated embodiment, a wafer 105 is processed by the processing line 110 to fabricate a completed wafer 115 including at least partially completed integrated circuit devices, each commonly referred to as a die 120. The processing line 110 may include a variety of processing tools (not shown) and/or metrology tools (not shown), which may be used to process and/or examine the wafer 105 to fabricate the semiconductor devices. For example, the processing tools may include photolithography steppers, etch tools, deposition tools, polishing tools, rapid thermal anneal tools, ion implantation tools, and the like. The metrology tools may include thickness measurement tools, scatterometers, ellipsometers, scanning electron microscopes, and the like. Techniques for processing the wafer 105 are well known to persons of ordinary skill in the art and therefore will not be discussed in detail herein to avoid obscuring the present invention. Although a single wafer 105 is pictured in FIG. 1, it is to be understood that the wafer 105 is representative of a single wafer as well as a group of wafers, e.g. all or a portion of a wafer lot that may be processed in the processing line 110.

After the wafer 105 has been processed in the processing line 110 to fabricate the completed wafer 115, the wafer 115 is provided to the FWET metrology tool 125. The FWET metrology tool 125 gathers detailed electrical performance measurements for the completed wafer 115. Final wafer electrical testing (FWET) entails parametric testing of discrete structures like transistors, capacitors, resistors, interconnects and relatively small and simple circuits, such as ring oscillators. It is intended to provide a quick indication as to whether or not the wafer is within basic manufacturing specification limits. Wafers that exceed these limits are typically discarded so as to not waste subsequent time or resources on them.

For example, FWET testing may be performed at the sites 135 identified on the wafer 115. In one embodiment, FWET data may be collected at one or more center sites and a variety of radial sites around the wafer 115. Of course, the number and distribution of FWET sites may vary depending on the particular implementation. Exemplary FWET parameters include, but are not limited to, diode characteristics, drive current characteristics, gate oxide parameters, leakage current parameters, metal layer characteristics, resistor characteristics, via characteristics, etc. The particular FWET parameters selected may vary depending on the application and the nature of the device formed on the die.

Table 1 below provides an exemplary, but not exhaustive, list of the types of FWET parameters collected (i.e., designated by "(F)" following the parameter description).

Following FWET metrology, the wafers 115 are provided to the SORT metrology tool 130. At SORT, individual dies are tested for functionality, which is a typically much longer and more involved test sequence than FWET, especially in the case of a microprocessor. The SORT metrology tool 130 employs a series of probes to electrically contact pads on the completed die 120 to perform electrical and functional tests. For example, the SORT metrology tool 130 may measure voltages and/or currents between various nodes and circuits that are formed on the wafer 115. Exemplary SORT parameters measured include, but are not limited to, clock search parameters, diode characteristics, scan logic voltage, static IDD, VDD min, power supply open short characteristics, and ring oscillator frequency, etc. The particular SORT parameters selected may vary depending on the application and the nature of the device formed on the die. Table 1 below provides an exemplary, but not exhaustive, list of the types of SORT parameters collected (i.e., designated by "(S)" following the parameter description). Typically, wafer SORT metrology is performed on each die 120 on the wafer 115 to determine functionality and baseline performance data.

TABLE 1

Die Performance Parameters

| Block | Category | Type | Parameter |
|---|---|---|---|
| PMIN | VDDmin | Scan Logic | Minimum Voltage (S) |
| | | BIST | Minimum Voltage (S) |
| LEAK | Gate Oxide | NOxide | Oxide Thickness (F) |
| | | POxide | Oxide Thickness (F) |
| | Leakage | NLeak | Leakage Current (F) |
| | | PLeak | Leakage Current (F) |
| | | SSID | Static IDD (S) |
| | | NJunction | N Junction Parameters (F) |
| | Drive | NDrive | Drive Current (F) |
| | | PDrive | Drive Current (F) |
| YIELD | Metal | Metal 1 | Various Resistance (F) |
| | | | Various Leakage (F) |
| | | . | |
| | | . | |
| | | . | |
| | | Metal n | Various Resistance (F) |
| | | | Various Leakage (F) |
| | Open Short | VDD Short | Resistance, Continuity, and Short Parameters (F,S) |
| | | VtShort | Resistance, Continuity, and Short Parameters (F,S) |
| | Via | Via 1 | Resistance (F) |
| | | . | |
| | | . | |
| | | . | |
| | | Via n | Resistance (F) |
| | Clock | Clock Search | Clock Edge Parameters (S) |
| | Bin Result | Test Classifier | Fail Type Indicator |
| SPEED | Resistor | NPoly | Resistance (F) |
| | | NRes | Resistance (F) |
| | RO | RO Freq | Ring Oscillator Frequency (S) |
| | | RO Pass/Fail | Pass/Fail (S) |
| | Miller | NMiller | Miller Capacitance (F) |
| | | PMiller | Miller Capacitance (F) |
| | Diode | Ideality | Thermal Diode Parameters (S) |
| | | Thermal Diode | Thermal Diode Measurements (S) |

The results of the SORT and FWET testing may be stored in the data store 140 for further evaluation. In one embodiment of the invention, the SORT and FWET data are employed to generate die performance metrics for each of the die 120 on the wafer 115, as described in greater detail below. As described in greater detail below, the die performance metrics associated with neighboring die are also incorporated into the final die performance metric for a given die. Such die performance metrics provide an overall indication of the performance of each die 120. Die performance metrics are generally based on multivariate groupings of parameters. Generally, the die performance metric evaluates performance for at least one non-yield related performance characteristic. For example, speed, minimum voltage, and leakage metrics are exemplary non-yield performance metrics. As described in greater detail below, a yield metric may be considered in conjunction with the performance metrics to determine an overall performance metric. To generate a die performance metric for each individual die, in accordance with the illustrated embodiment, both SORT and FWET data are used. However, because FWET data is not collected for each site, estimated FWET parameters are generated for the non-measured sites by the die performance unit 145.

As described in greater detail below, a die performance model, such as a principal components analysis (PCA) model, is used by the die performance unit 145 to generate a preliminary die performance metric for each die based on the collected SORT data and collected and estimated FWET data. For the untested die, the SORT and estimated FWET data are used to generate die performance metrics, while for the tested die, the SORT and measured FWET data are employed to generate die performance metrics.

Figure 2:
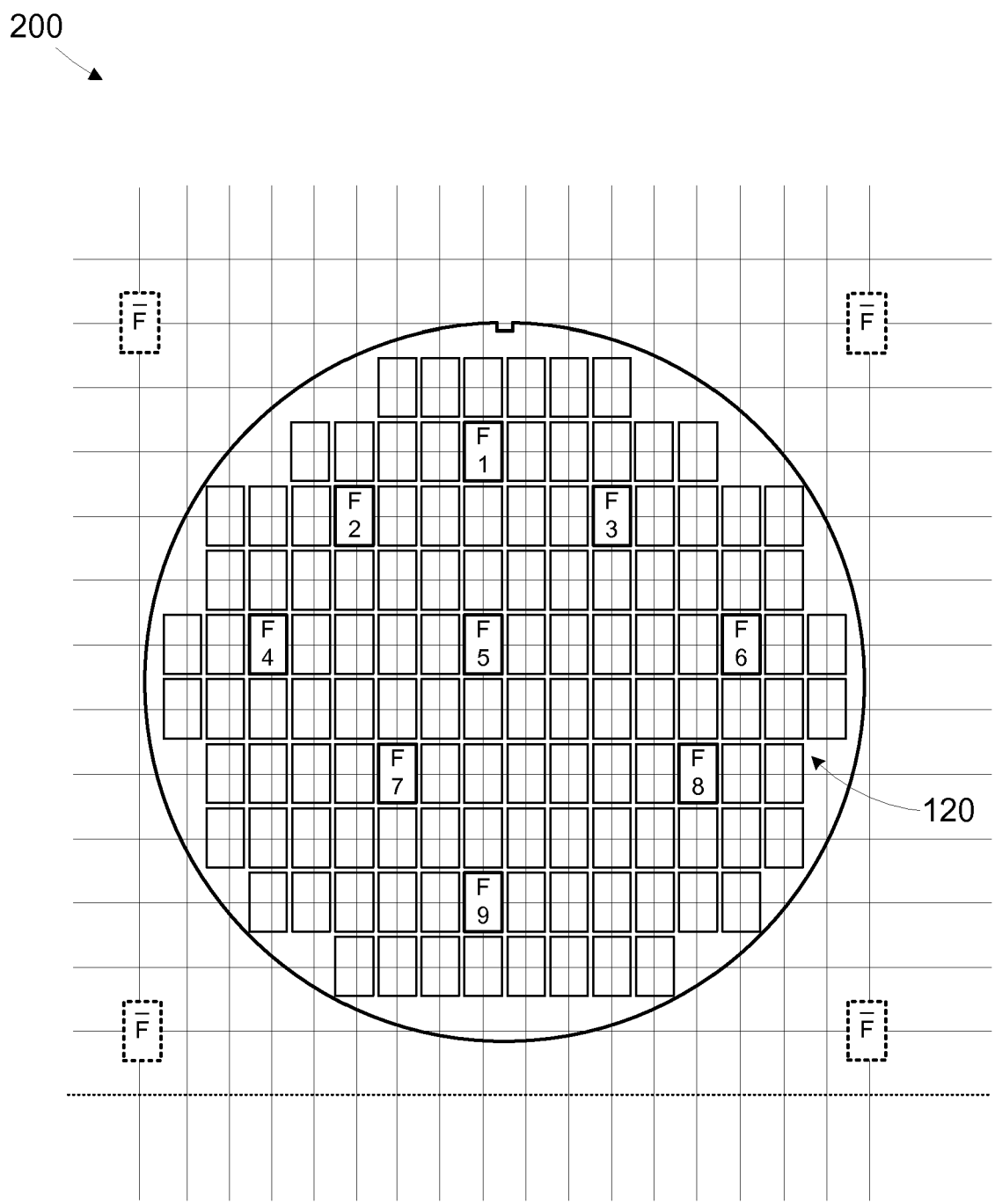
FIG. 2 is a diagram of a wafer map used for data expansion by the die performance unit of FIG. 1.

Turning now to FIG. 2, a diagram illustrating a wafer map 200 used by the die performance unit 145 to generate estimated FWET data for unmeasured die is shown. In the illustrated embodiment, a splined interpolation is used to estimate the FWET parameters for the untested die. A separate splined interpolation may be performed for each FWET parameter measured. Prior to the interpolation, the FWET data may be filtered using techniques as a box filter or sanity limits to reduce noise in the data.

The splined interpolation considers the actual measured FWET parameter values at the tested die locations, as represented by sites F1-F8 in FIG. 2. To facilitate the splined interpolation, derived data points, $\overline{F}$, are placed at various points on the wafer map 200 outside the portion that includes the wafer. The $\overline{F}$ values represent the wafer mean value for the FWET parameter being interpolated. In the example wafer map 200 of FIG. 2, the wafer mean values, $\overline{F}$, are placed at the diagonal corners of the wafer map 200. In other embodiment, different numbers or different placements of wafer mean values may be used on the wafer map 200. The output of the splined interpolation is a function that defines estimated FWET parameter values at different coordinates of the grid defining the wafer map 200.

A splined interpolation differs from a best-fit interpolation in that the interpolation is constrained so that the curve passes through the observed data points. Hence, for the tested die, the value of the splined interpolation function at the position of the tested die matches the measured values for those die. Due to this correspondence, when employing the splined interpolation, the interpolation function may be used for both tested and untested die, thus simplifying further processing by eliminating the need to track which die were tested.

The particular mathematical steps necessary to perform a splined interpolation are known to those of ordinary skill in the art. For example, commercially available software, such as MATLAB®, offered by The MathWorks, Inc. of Natick, Mass. includes splined interpolation functionality.

Figure 3:
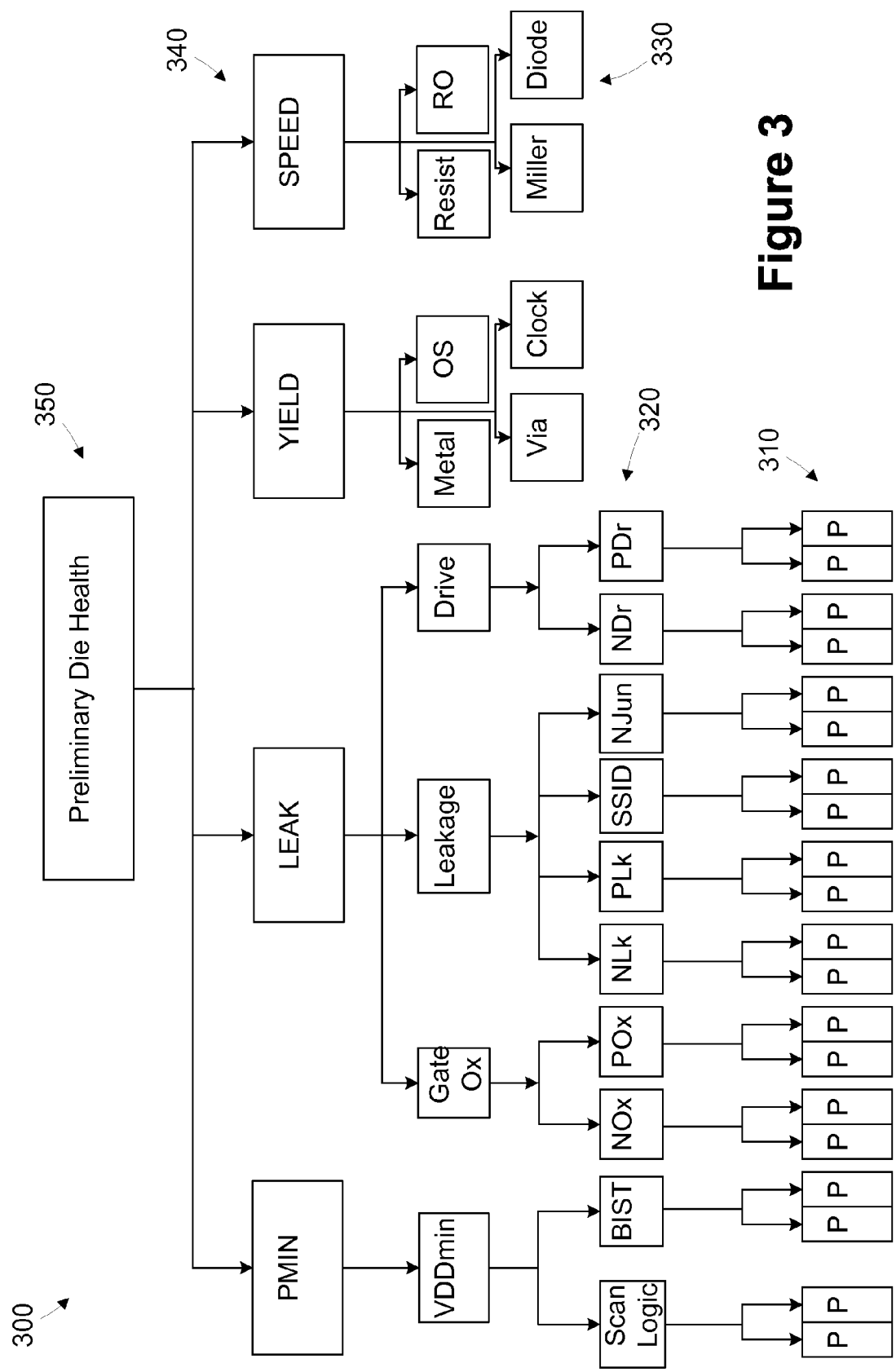
FIG. 3 is a diagram illustrating a hierarchy used by the die performance unit of FIG. 1 for grouping SORT and FWET test parameters for determining die performance.

Following the data expansion, the die performance unit 145 generates a preliminary die performance metric for each die 120. The parameters listed in Table 1 represent univariate inputs to a model that generates a die performance metric for a given die using only parameters associated with that die. The block, category, and type groupings represent multivariate grouping of the parameters. FIG. 3 illustrates an exemplary hierarchy 300 for the model using the parameters and groupings illustrated in Table 1 for generating preliminary die performance metric information. Only a subset of the parameter types and categories are illustrated for ease of illustration. The hierarchy 300 includes a parameter level 310 representing individual parameters gathered during the SORT and FWET tests. In the case of the FWET parameters, the data expansion described above is used to generate estimated FWET parameters for the untested die.

A first grouping of parameters 310 is employed to generate a type level 320, and multiple types may be grouped to define a category level 330. Multiple categories may be grouped to define a block level 340. The combination of the block level 340 groupings defines a preliminary die performance metric 350 for the given die 120. In the illustrated embodiment, the PMIN block includes a VDDmin category and scan logic and BIST types. The leakage block includes gate oxide, leakage, and drive categories, with the type groupings shown. The yield block includes metal, open short, via, clock, and bin result categories. The speed block includes resistor, ring oscillator, Miller, and diode categories. For ease of illustration, the types and parameters are not illustrated for the yield and speed blocks, as they may be similarly grouped using the hierarchy 300. Again, the particular parameters 310, number of blocks 340, categories 330, and types 320 are intended to be illustrative and not to limit the present invention. In alternative embodiments, any desirable number of hierarchy layers may be chosen, and each layer may be grouped into any desirable number of groups.

Figure 4:
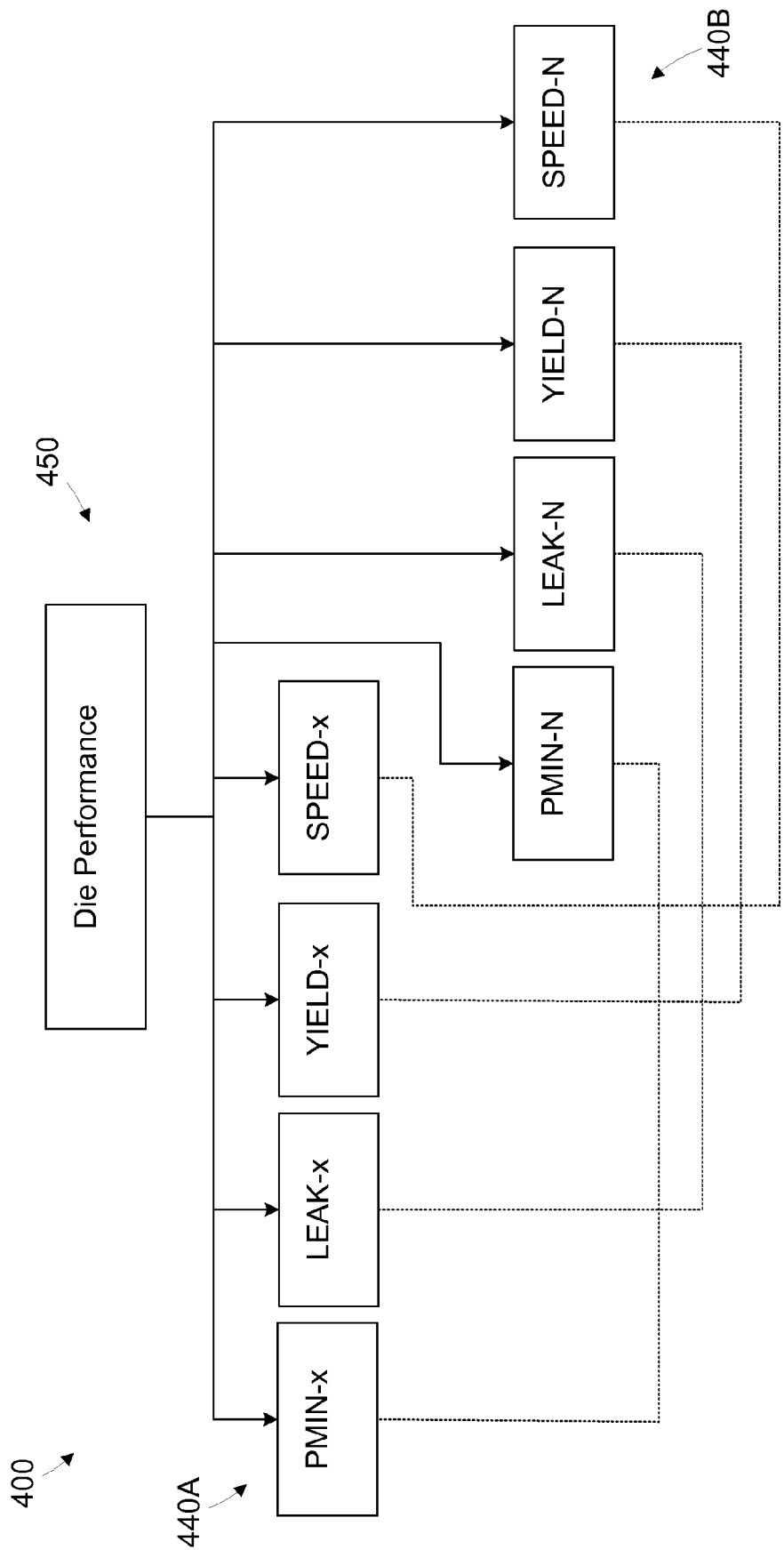
FIG. 4 is a diagram of a hierarchy including neighborhood performance metrics.

Referring now to FIG. 4, a second hierarchy 400 is illustrated that incorporates the individual die performance metrics 440A (i.e., designated by die-x) generated in accordance with the hierarchy of FIG. 3 with corresponding die performance metrics 440B for neighboring die (i.e., designated by neighbor-N) into the die performance metric 450. To implement the hierarchy 400 of FIG. 4, the die performance unit 145 first determines the die performance metrics, at least to the block level 340 for each die in a set (e.g., wafer or lot). The die performance unit 145 then determines which die are considered neighboring die for a given die and generates the neighborhood block metrics 440B for that subset. For example, the neighboring die performance metrics 440B may be determined by averaging the individual performance metrics for the die in the neighborhood. Subsequently, the die performance unit 145 runs the die performance model again using the parameters 440A associated with the given die and the parameters 440B determined for its neighbors. Although only the block level parameters 440A are illustrated, the die performance unit 145 may also apply the model using the other levels of the hierarchy 300 shown in FIG. 3.

In FIG. 4, the neighborhood die metrics 440B are illustrated in the hierarchy below the overall die performance metric 450. In some embodiments, the neighborhood performance metrics 440B are incorporated into the individual die performance metrics 440A. For example, the SPEED neighborhood metric may be incorporated into the corresponding SPEED die metric or the LEAKAGE neighborhood metric may be incorporated into the die LEAKAGE metric as indicated by the dashed lines in FIG. 4.

The particular groupings the die performance unit 145 may use for identifying neighboring die may vary. Exemplary die neighborhood designations may include the die immediately surrounding the given die, the die positioned at the same radial position from the center of the wafer, the die in the same position in a lithography reticle cluster, and the die from other wafers in the same lot that are in the same x-y position on the wafer grid. Of course, other neighborhoods may be defined, depending on the particular embodiment and the nature of the devices being fabricated. Although only a single set of neighborhood metrics are illustrated in FIG. 4, it is contemplated that multiple neighborhoods may be used. For example, neighborhood metrics may be determined for each of the possible neighborhood groupings listed, and all the neighborhood metrics may contribute toward the overall performance metric for the given die.

The die performance unit 145 may report both the preliminary die performance metric 350 for the given die, as well as the neighborhood-adjusted die performance metric 450 for comparison purposes. For example, if the preliminary die performance metric 350 indicates a die with relatively high die performance, the test requirements may be lowered for that die if no other factors were considered. However, if the neighborhood performance metrics 450 indicate that the degree of certainty of the individual die performance metric is suspect as the die in the same neighborhood do not have consistently high performance metrics, more aggressive burn-in testing may be warranted to stress the die and verify its level of performance. Alternatively, the die performance unit 145 may not determine or report the preliminary die performance metric 350, and may only report the die performance metric 450 that considers the neighborhood metrics.

Residual values may be determined by comparing the die performance metrics 440A to the neighboring die metrics 440B. The size of the residuals represent the distance between the selected die and the others in its neighborhood grouping. Rather than repeating the model, the die performance unit 145 may adjust the preliminary die performance metric 350 based on the size of the residuals to generate the overall die performance metric 450. If the residuals were small, it would indicate that the subject die is consistent with its neighbors and that the preliminary die performance metric 350 may be accurate. On the other hand, large residuals would indicate a higher degree of uncertainty with respect to the preliminary die performance metric 350, resulting in a lowering of the overall die performance metric 450.

One type of model that may be used, as described in greater detail below, is a recursive principal components analysis (RPCA) model. Die performance metrics are calculated by comparing data for all parameters from the current die and the neighboring die to a model built from known-good die. For an RPCA technique, this metric is the (Pr statistic, which is calculated for every node in the hierarchy, and is a positive number that quantitatively measures how far the value of that node is within or outside 2.8-σ of the expected distribution. The nodes of the hierarchy include an overall performance metric 450 for the die, and the various blocks 440, categories 430, types 420 and univariates for individual FWET and SORT parameters 410. These $\phi_r$ values and all die-level results plus their residuals are stored in the data store 140 by the die performance unit 145.

Although the application of the present invention is described as it may be implemented using a RPCA model, the scope is not so limited. Other types of multivariate statistics-based analysis techniques that consider a large number of parameters and generate a single quantitative metric (i.e., not just binary) indicating the "goodness" of the die may be used. For example, one alternative modeling technique includes a k-Nearest Neighbor (KNN) technique.

Principal component analysis (PCA), of which RPCA is a variant, is a multivariate technique that models the correlation structure in the data by reducing the dimensionality of the data. A data matrix, X, of n samples (rows) and m variables (columns) can be decomposed as follows:

$$X = \hat{X} + \tilde{X}, \quad (1)$$

where the columns of X are typically normalized to zero mean and unit variance. The matrices $\hat{X}$ and $\tilde{X}$ are the modeled and unmodeled residual components of the X matrix, respectively. The modeled and residual matrices can be written as $$\hat{X} = TP^T \text{ and } \tilde{X} = \tilde{T}\tilde{P}^T, \quad (2)$$

where $T \in \Re^{n \times l}$ and $P \in \Re^{m \times l}$ are the score and loading matrices, respectively, and l is the number of principal components retained in the model. It follows that $\tilde{T} \in \Re^{n \times (m-l)}$ and $\tilde{P} \in \Re^{m \times (m-l)}$ are the residual score and loading matrices, respectively.

The loading matrices, P and $\tilde{P}$, are determined from the eigenvectors of the correlation matrix, R, which can be approximated by $$R \approx \frac{1}{n-1} X^T X. \quad (3)$$

The first l eigenvectors of R (corresponding to the largest eigenvalues) are the loadings, P, and the eigenvectors corresponding to the remaining m-l eigenvalues are the residual loadings, $\tilde{P}$.

The number of principal components (PCs) retained in the model is an important factor with PCA. If too few PCs are retained, the model will not capture all of the information in the data, and a poor representation of the process will result. On the other hand, if too many PCs are chosen, then the model will be over parameterized and will include noise. The variance of reconstruction error (VRE) criterion for selecting the appropriate number of PCs is based on omitting parameters and using the model to reconstruct the missing data. The number of PCs which results in the best data reconstruction is considered the optimal number of PCs to be used in the model. Other, well-established methods for selecting the number of PCs include the average eigenvalues method, cross validation, etc.

A variant of PCA is recursive PCA (RPCA). To implement an RPCA algorithm it is necessary to first recursively calculate a correlation matrix. Given a new vector of unscaled measurements, $x_{k+1}^0$, the updating equation for the correlation matrix is given by $$R_{k+1} = \mu \sum_{k+1}^{-1} \left( \sum_k R_k \sum_k + \Delta b_{k+1} \Delta b_{k+1}^T \right) \sum_{k+1}^{-1} + (1-\mu) x_{k+1} x_{k+1}^T, \quad (4)$$

where $x_{k+1}$ is the scaled vector of measurements, b is a vector of means of the data, and Σ is a diagonal matrix with the $i^{th}$ element being the standard deviation of the $i^{th}$ variable. The mean and variance are updated using $$b_{k+1} = \mu b_k + (1-\mu) x_{k+1}^0, \text{ and} \quad (5)$$

$$\sigma_{k+1}^2(i) = \mu(\sigma_k^2(i) + \Delta b_{k+1}^2(i)) + (1-\mu) \times \|x_{k+1}^0(i) - b_{k+1}(i)\|^2. \quad (6)$$

The forgetting factor, μ, is used to weight more recent data heavier than older data. A smaller μ discounts data more quickly.

After the correlation matrix has been recursively updated, calculating the loading matrices is performed in the same manner as ordinary PCA. It is also possible to employ computational shortcuts for recursively determining the eigenvalues of the correlation matrix, such as rank-one modification.

Die performance prediction using PCA models is accomplished by considering two statistics, the squared prediction error (SPE) and the Hotelling's $T^2$ statistic. These statistics may be combined to generate a combined index, as discussed below. The SPE indicates the amount by which a process measurement deviates from the model with $$\text{SPE} = x^T (I - PP^T) x = x^T \Phi_{SPE} x, \quad (7)$$

where $$\Phi_{SPE} = I - PP^T. \quad (8)$$

Hotelling's $T^2$ statistic measures deviation of a parameter inside the process model using $$T^2 = x^T P \Lambda^{-1} P^T x = x^T \Phi_{T^2} x, \quad (9)$$

where $$\Phi_{T^2} = P \Lambda^{-1} P^T, \quad (10)$$

and Λ is a diagonal matrix containing the principal eigenvalues used in the PCA model. The notation using $\Phi_{SPE}$ and $\Phi_{T^2}$ is provided to simplify the multiblock calculations included in the next section. The process is considered normal if both of the following conditions are met:

$$\text{SPE} \leq \delta_2,$$

$$T^2 \leq \chi_l^2 \quad (11)$$

where $\delta^2$ and $\chi_l^2$ are the confidence limits for the SPE and $T^2$ statistics, respectively. It is assumed that x follows a normal distribution and $T^2$ follows a $\chi^2$ distribution with l degrees of freedom.

The SPE and $T^2$ statistics may be combined into the following single combined index for the purpose of determining the die performance metric $$\varphi = \frac{SPE(x)}{\delta^2} + \frac{T^2(x)}{\chi_l^2} = x^T \Phi x, \quad (12)$$

where $$\Phi = \frac{P\Lambda^{-1}P^T}{\chi_l^2} + \frac{I - PP^T}{\delta^2}. \quad (13)$$

The confidence limits of the combined index are determined by assuming that φ follows a distribution proportional to the $\chi^2$ distribution. It follows that Φ is considered normal if $$\phi \leq g\chi_\alpha^2(h), \tag{14}$$

where α is the confidence level. The coefficient, g, and the degrees of freedom, h, for the $\chi^2$ distribution are given by $$g = \frac{tr(R\Phi)^2}{tr(R\Phi)}, \text{ and} \tag{15}$$

$$h = \frac{[tr(R\Phi)]^2}{tr(R\Phi)^2}. \tag{16}$$

To provide an efficient and reliable method for grouping sets of variables together and identifying the die performance, a multiblock analysis approach may be applied to the $T^2$ and SPE. The following discussion describes those methods and extends them to the combined index. Using an existing PCA model, a set of variables of interest $x_b$ can be grouped into a single block as follows:

$$x^T = [x_1^T \ldots x_b^T \ldots x_B^T]. \tag{17}$$

The variables in block b should have a distinct relationship among them that allows them to be grouped into a single category for die performance purposes. The correlation matrix and Φ matrices are then partitioned in a similar fashion.

$$R = \begin{bmatrix} R_1 & & & \\ & \ddots & & \\ & & R_b & \\ & & & \ddots \\ & & & & R_B \end{bmatrix} \tag{18}$$

$$\Phi = \begin{bmatrix} \Phi_1 & & & \\ & \ddots & & \\ & & \Phi_b & \\ & & & \ddots \\ & & & & \Phi_B \end{bmatrix} \tag{19}$$

The contributions associated with block b for the SPE and $T^2$ and extended here to the combined index can be written as $$T_b^2 = x_b^T \Phi_{T_b^2} x_b \tag{20}$$

$$SPE_b = x_b^T \Phi_{SPE_b} x_b \tag{21}$$

$$\phi_b = x_b^T \Phi_{\phi_b} x_b. \tag{22}$$

The confidence limits for each of these quantities is calculated by modifying Equations 14, 15, and 16 to incorporate the multiblock quantities. While defined for the combined index, similar calculations hold for SPE and $T^2$.

$$g_{\varphi_b} = \frac{tr(R_b \Phi_{\varphi_b})^2}{tr(R_b \Phi_{\varphi_b})} \tag{23}$$

$$h_{\varphi_b} = \frac{[tr(R_b \Phi_{\varphi_b})]^2}{tr(R_b \Phi_{\varphi_b})^2} \tag{24}$$

$$\varphi_{b,\lim} = g_{\varphi_b} \chi^2(h_{\varphi_b}) \tag{25}$$

The combined index used as the die performance metric is defined by:

$$\varphi_r = \varphi_{b,r} = \log_{10}\left(\frac{\varphi_b}{\varphi_{b,\lim}}\right) + 1. \tag{26}$$

By incorporating the die performance metrics associated with neighboring die into an overall die performance metric for a particular die, the certainty associated with the overall die performance metric may be increased. For example, if a preliminary die performance metric 350 for a given die indicates a relatively high performance, but the die performance metrics 440B associated with the neighboring die indicate a lower performance, the value of the preliminary die performance metric 350 may be suspect. The individual die may have performed well during the SORT testing, but latent issues may be present with the die that may only become apparent after a period of use. The degree of uncertainty with the preliminary die performance metric 350 may be suggested by the neighboring die performance metrics 440B. This degree of uncertainty results in a lowering of the overall die performance metric 450 determined by incorporating the neighboring die performance metrics 440B. If there is no such mismatch between the preliminary die performance metric 350 and the neighboring die performance metrics 440B, the confidence level of the of preliminary die performance metric 350 is higher, and the overall die performance metric 450 would not be lowered relative to the preliminary die performance metric 350 based on the contribution of the neighboring die performance metrics 440B.

The die performance metrics 350, 440A, 440B, 450 computed for the die 120 may be used for various purposes. In one embodiment, the die performance metric is employed by the sampling unit 150 to determine subsequent testing requirements, such as burn-in. To decide which die undergo burn-in, the sampling unit 150 uses die performance thresholds in combination with other known characteristics of the die 120, such as bin classification.

The die performance information may also be considered in determining the market segment for the die 120. For example, in the case where the semiconductor devices are microprocessors, the packaged devices may be designated for use in a server, desktop computer, or mobile computer depending on the determined die performance.

The die performance unit 145 may implement various rules for determining test requirements and/or market segment based on the die performance metrics 350, 440A, 440B, 450. Table 2 below illustrates exemplary rules for determining market segment and burn-in test requirements.

TABLE 2

| | Server | Mobile | | | Desktop | | | |
|---|---|---|---|---|---|---|---|---|
| | BI | SKIP BI | RED BI | BI | SKIP BI | RED BI | BI | Scrap |
| YIELD | $<Y_1$ | $<Y_1$ | $>Y_1, <Y_2$ | $>Y_1, <Y_3$ | $<Y_1$ | $>Y_1, <Y_2$ | $>Y_1, <Y_3$ | $>Y_3$ |
| LEAK | $<L_2$ | $<L_1$ | $<L_1$ | $<L_2$ | $<L_2$ | $<L_2$ | $<L_2$ | $>L_2$ |
| SPEED | $<S_s$ | $<S_s$ | $<S_s$ | $<S_s$ | $<S_s$ | $<S_s$ | $<S_s$ | $>S_s$ |
| PMIN | $<V_s$ | $<V_1$ | $<V_1$ | $<V_1$ | $<V_s$ | $<V_s$ | $<V_s$ | $<V_s$ |

The various thresholds illustrated in Table 2 are exemplary and may vary depending on the particular embodiment. Based on the determined die performance metric and the exemplary rules listed in Table 2, the die performance unit 145 may determine the market segment assigned to each die and/or the burn-in test requirements. If particular die performance metrics are above certain thresholds, the die may be scrapped, as illustrated in Table 2. As specified by Table 2, multiple levels of burn-in may b specified. For example, the thresholds may be used to identify die 120 that should be subjected to a less strenuous burn-in (e.g., lower temperature or reduced time).

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method, comprising:
receiving a first set of parameters measured for a plurality of die in a computing device;
determining a first die non-yield performance metric for a selected die based on a first subset of the first set of parameters in the computing device, the first subset including parameters measured for the selected die;
determining at least one neighborhood die non-yield performance metric associated with a set comprised of a plurality of additional die that neighbor the selected die based on a second subset of the first set of parameters in the computing device, the second subset including parameters measured for the additional die; and
determining a second die performance metric for the selected die based on a combination of the first die non-yield performance metric and the neighborhood die non-yield performance metric in the computing device.

2. The method of claim 1, wherein the set of neighboring die includes die disposed proximate the selected die.

3. The method of claim 1, wherein the set of neighboring die includes die disposed at a common radial position on a wafer.

4. The method of claim 1, wherein the set of neighboring die includes die in a common position in a lithography reticle cluster.

5. The method of claim 1, wherein the set of neighboring die includes die from a group of wafers disposed in a common wafer grid position.

6. The method of claim 1, wherein the second die performance metric further comprises at least one of a speed metric, a leakage metric, a minimum voltage metric, and an overall performance metric.

7. The method of claim 1, wherein the second die performance metric comprises an overall performance metric including at least one non-yield performance component and at least one yield component.

8. The method of claim 1, wherein the first set of parameters is associated with a subset of a plurality of die on a wafer subjected to testing and determining the first die non-yield performance metric and the neighborhood die non-yield performance metric further comprises:
expanding the first set of parameters to generate estimated values for the first set of parameters for at least one untested die not included in the subset; and
determining at least one of the first die non-yield performance metric and the neighborhood die non-yield performance metric based on the first set of parameters including the estimated values.

9. The method of claim 8, wherein expanding the first set of parameters further comprises expanding the first set of parameters using a splined interpolation.

10. The method of claim 9, further comprising:
determining a wafer mean value of a wafer for a selected parameter;
defining a wafer map including the wafer, the wafer map including measured values for the selected parameter located in positions corresponding to the tested die;
placing the wafer mean value at a plurality of predetermined positions on the wafer map outside a portion of the wafer map including the wafer; and
performing the splined interpolation using the measured values and the wafer mean values at the positions defined by the wafer map.

11. The method of claim 8, further comprising:
receiving a second set of parameters associated with the plurality of die, the second set of parameters comprising SORT parameters and the first set of parameters comprising final wafer electrical test (FWET) parameters; and
determining at least one of the first die non-yield performance metric and the neighborhood die non-yield performance metric based on the first set of parameters including the estimated values and the second set of parameters.

12. The method of claim 1, further comprising testing the selected die, wherein a protocol of the testing is determined based on the second die performance metric.

13. The method of claim 12, wherein the testing protocol comprises burn-in testing.

14. The method of claim 12, wherein the testing protocol comprises at least one of reduced time burn-in testing and reduced temperature burn-in testing.

15. The method of claim 1, further comprising determining at least one of the first die non-yield performance metric and the neighborhood die non-yield performance metric using a multivariate statistical model.

16. The method of claim 15, wherein the model comprises at least one of a principal components analysis model, a recursive principal components analysis model, and a k-nearest neighbor model.

17. The method of claim 1, further comprising assigning a market segment code to the selected die based on the second die performance metric.

18. The method of claim 17, wherein the market segment code comprises at least one of a server segment, a mobile segment, and a desktop segment.

19. A system, comprising:
a first metrology tool operable to measure a first set of parameters associated with a plurality of die; and
a die performance unit operable to determine a first die non-yield performance metric for a selected die from the plurality of die based on a first subset of the first set of parameters, the first subset including parameters measured for the selected die, determine at least one neighborhood die non-yield performance metric associated with a set comprised of a plurality of die that neighbor the selected die based on a second subset of the first set of parameters, the second subset including parameters measured for the additional die, and determine a second die performance metric for the selected die based on a combination of the first die non-yield performance metric and the neighborhood die non-yield performance metric.

20. A system, comprising:
means for measuring a first set of parameters associated with a plurality of die;
means for determining a first die non-yield performance metric for a selected die based on a first subset of the first set of parameters in the computing device, the first subset including parameters measured for the selected die;
means for determining at least one neighborhood die non-yield performance metric associated with a set comprised of a plurality of additional die that neighbor the selected die based on a second subset of the first set of parameters in the computing device, the second subset including parameters measured for the additional die; and
means for determining a second die performance metric for the selected die based on a combination of the first die non-yield performance metric and the neighborhood die non-yield performance metric.

* * * * *